(12) United States Patent
Lee (10) Patent No.: US 9,576,895 B2
(45) Date of Patent: *Feb. 21, 2017

(54) SEMICONDUCTOR DEVICE WITH DAMASCENE BIT LINE AND METHOD FOR FABRICATING THE SAME

(71) Applicant: SK hynix Inc., Gyeonggi-do (KR)

(72) Inventor: Nam-Yeal Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,238

(22) Filed: Jan. 5, 2016

(65) Prior Publication Data

US 2016/0133564 A1 May 12, 2016

Related U.S. Application Data

(62) Division of application No. 14/551,982, filed on Nov. 24, 2014, now Pat. No. 9,275,937, which is a division
(Continued)

(30) Foreign Application Priority Data

Oct. 12, 2011 (KR) ........................ 10-2011-0104139

(51) Int. Cl.
*H01L 21/4763* (2006.01)
*H01L 21/768* (2006.01)
(Continued)

(52) U.S. Cl.
CPC ....... *H01L 23/5226* (2013.01); *H01L 21/7682* (2013.01); *H01L 21/76897* (2013.01); *H01L 23/481* (2013.01); *H01L 23/528* (2013.01); *H01L 23/5222* (2013.01); *H01L 23/53209* (2013.01); *H01L 23/53295* (2013.01); *H01L 27/10814* (2013.01); *H01L 27/10855* (2013.01); *H01L 27/10885* (2013.01);
(Continued)

(58) Field of Classification Search
CPC .......... H01L 21/76897; H01L 21/7682; H01L 23/5222; H01L 1127/10885; H01L 23/10855; H01L 23/11517
See application file for complete search history.

(56) References Cited

U.S. PATENT DOCUMENTS

8,637,930 B2 * 1/2014 Ando ................ H01L 29/66803
257/347
8,916,936 B2 * 12/2014 Lee ........................ H01L 27/088
257/368
(Continued)

*Primary Examiner* — David Zarneke
(74) *Attorney, Agent, or Firm* — IP & T Group LLP (57) ABSTRACT

A semiconductor device includes a substrate having a plurality of contact surfaces, an interlayer dielectric layer formed over the substrate and having a first open portion which exposes a part of the contact surfaces and a second open portion which exposes the other contact surfaces, a storage node contact (SNC) plug filling the first open portion, and a damascene structure filing the second open portion and including a bit line, a spacer formed on both sidewalls of the bit line, a capping layer formed over the bit line and the spacer, and an air gap formed between the bit line and the spacer. The bit line includes a conductive material of which the volume is contracted by a heat treatment to form the air gap.

5 Claims, 8 Drawing Sheets

Related U.S. Application Data of application No. 13/338,379, filed on Dec. 28, 2011, now Pat. No. 8,921,223.

(51) Int. Cl.
    *H01L 23/522*     (2006.01)
    *H01L 23/532*     (2006.01)
    *H01L 27/108*     (2006.01)
    *H01L 23/48*     (2006.01)
    *H01L 29/45*     (2006.01)
    *H01L 23/528*     (2006.01)
    *H01L 29/40*     (2006.01)
    *H01L 29/78*     (2006.01)
    *H01L 27/115*     (2006.01)

(52) U.S. Cl.
    CPC ........ *H01L 29/45* (2013.01); *H01L 27/11517* (2013.01); *H01L 29/401* (2013.01); *H01L 29/78* (2013.01); *H01L 2924/0002* (2013.01)

(56) References Cited

U.S. PATENT DOCUMENTS

| | | | | |
|---|---|---|---|---|
| 8,921,223 B2* | 12/2014 | Lee | ................ | H01L 27/10855 438/619 |
| 9,123,774 B2* | 9/2015 | Suk | ................ | H01L 29/66545 |
| 9,275,937 B2* | 3/2016 | Lee | ................ | H01L 27/10855 |
| 2006/0073695 A1* | 4/2006 | Filippi | ............ | H01L 21/76807 438/619 |
| 2010/0025775 A1* | 2/2010 | Giles | ................ | H01L 23/485 257/386 |
| 2011/0037111 A1* | 2/2011 | Kim | ................ | H01L 27/10885 257/302 |
| 2011/0217838 A1* | 9/2011 | Hsieh | ................ | H01L 21/768 438/618 |
| 2012/0168899 A1* | 7/2012 | Kim | ................ | H01L 21/7682 257/522 |
| 2013/0248950 A1* | 9/2013 | Kang | ................ | H01L 29/78 257/288 |
| 2014/0175659 A1* | 6/2014 | Lee | ................ | H01L 21/764 257/773 |
| 2014/0179101 A1* | 6/2014 | Lee | ................ | H01L 21/7682 438/666 |
| 2014/0179102 A1* | 6/2014 | Joung | ................ | H01L 21/764 438/666 |
| 2014/0187037 A1* | 7/2014 | Rho | ................ | H01L 29/92 438/626 |
| 2014/0217545 A1* | 8/2014 | Kim | ................ | H01L 21/7682 257/522 |

* cited by examiner

SEMICONDUCTOR DEVICE WITH DAMASCENE BIT LINE AND METHOD FOR FABRICATING THE SAME

CROSS-REFERENCE TO RELATED APPLICATIONS

This application is a division of U.S. patent application Ser. No. 14/551,982 filed on Nov. 24, 2014, which is a division of U.S. patent application Ser. No. 13/338,379 filed on Dec. 28, 2011, now a U.S. Pat. No. 8,921,223, which claims priority of Korean Patent Application No. 10-2011-0104139, filed on Oct. 12, 2011. The disclosure of each of the foregoing applications is incorporated herein by reference in its entirety.

BACKGROUND

1. Field

Exemplary embodiments of the present invention relate to a method for fabricating a semiconductor device, and more particularly, to a semiconductor device with a damascene bit line and a method for fabricating the same.

2. Description of the Related Art

Recently, with the increase in integration degree of semiconductor devices, the difficulty level of a self-aligned contact (SAC) process has rapidly increased. The SAC process is performed for a storage node contact (SNC) plug after a bit line with a stacked structure is formed. In sub-30 nm memory devices, it may be difficult to secure en open area of an SNC hole and a SAC fail may frequently occur, due to such a reduction in process margin.

In order to solve such features, a damascene bit line process has been proposed. In the damascene bit line process, an SNC plug is first formed, and a bit line is subsequently formed.

In the damascene bit line process, two SNC plugs adjacent to each other are formed at once, and then separated from each other through a damascene process. Then, a bit line is formed to fill the inside of the damascene pattern. Through such a process, the SNC plugs may be more easily patterned than when the SNC plugs are separately formed. Furthermore, this process has an advantage in terms of the SAC fail, compared with a process in which the SNC plugs are formed later.

In the damascene bit lime process, a spacer may be formed on the sidewalls of the bit line, in order to prevent the bit line and the SNC plugs from being short-circuited.

The spacer may be formed of a dielectric layer such as silicon nitride or the like, Since the silicon nitride has a high dielectric constant, the silicon nitride may not be effective in suppressing parasitic capacitance between the bit line and the SNC plugs.

SUMMARY

Exemplary embodiments of the present invention are directed to a semiconductor device capable of reducing parasitic capacitance between a bit line and SNC plugs and a method for fabricating the same.

In accordance with an exemplary embodiment of the present invention, a semiconductor device includes a substrate having a plurality of contact surfaces, an interlayer dielectric layer formed over the substrate and having a first open portion which exposes a part of the contact surfaces and a second open portion which exposes the other contact surfaces, an SNC plug filling the first open portion, and a damascene structure filing the second open portion and including a bit line, a spacer formed on both sidewalls of the bit line, a capping layer formed over the bit line and the spacer, and an air gap formed between the bit line and the spacer. The bit line includes a conductive material of which the volume is contracted by a heat treatment to form the air gap.

In accordance with another exemplary embodiment of the present invention, a method for fabricating a semiconductor device includes forming an interlayer dielectric layer over a semiconductor substrate, forming an open portion by etching the interlayer dielectric layer, forming a damascene structure including a bit line partially filling the open portion, a spacer formed on both sidewalls of the bit line, and a capping layer formed over the bit line, and contracting the bit line through annealing to form an air gap between the bit line and the spacer.

In accordance with yet another exemplary embodiment of the present invention, a method for fabricating a semiconductor device includes forming a preliminary first conductive pattern over a semiconductor substrate, forming an open portion to separate the preliminary first conductive pattern into a plurality of independent first conductive patterns, forming a damascene structure in the first portion, wherein the damascene structure includes a second conductive pattern partially filling the open portion, a spacer formed on both sidewalls of the second conductive pattern, and a capping layer formed over the second conductive pattern, and contracting the second conductive pattern through annealing to form an air gap between the second conductive pattern and the spacer.

In accordance with still another exemplary embodiment of the present invention, a method for fabricating a semiconductor device includes forming an interlayer dielectric layer over a semiconductor substrate, forming a first open portion by etching the interlayer dielectric layer, forming a preliminary storage node contact (SNC) plug within the first open portion, forming a second open portion to separate the preliminary SNC plug into independent SNC plugs, forming a damascene structure in the second open portion, wherein the damascene structure includes a bit line partially filling the second open portion, a spacer formed on both sidewalls of the bit line, and a capping layer formed over the bit line, and contracting the bit line through annealing to form an air gap between the bit line and the spacer.

In accordance with still another exemplary embodiment of the present invention, a method for fabricating a semiconductor device includes forming an interlayer dielectric layer on the surface of a semiconductor substrate having a buried gate structure buried therein and contact surfaces, etching the interlayer dielectric layer and forming a first open portion to expose a part of the contact surfaces, forming a preliminary storage node contact SNC plug to fill the first open portion, etching the preliminary SNC plug and the interlayer dielectric layer and forming a second open portion to separate the preliminary SNC plug into a plurality of SNC plugs, forming a damascene structure in the open portion, wherein the damascene structure includes a bit line inside the second open portion, a spacer formed on both sidewalls of the bit line, and a capping layer formed over the bit line and the spacer, and contracting the bit line through annealing to form an air gap between the bit line and the spacer.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate. It not only refers to a case where the first layer is formed directly on the second layer or the substrate but also a case where a third layer exists between the first layer and the second layer or the substrate.

Figure 1A:
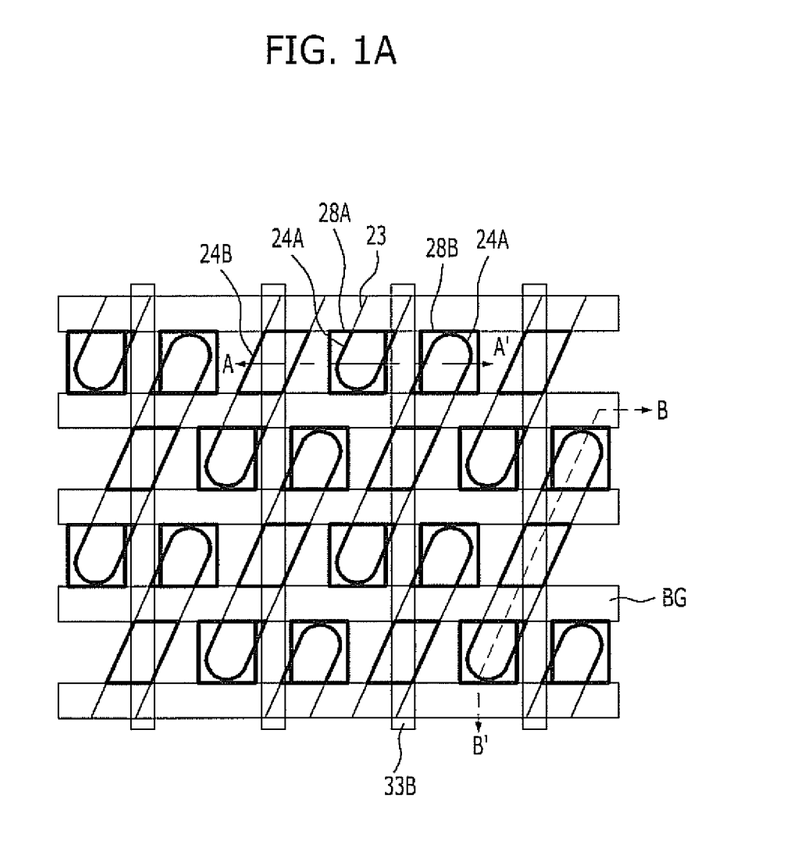
FIG. 1A is a plan view of a semiconductor device in accordance with an exemplary embodiment of the present invention.
Figure 1B:
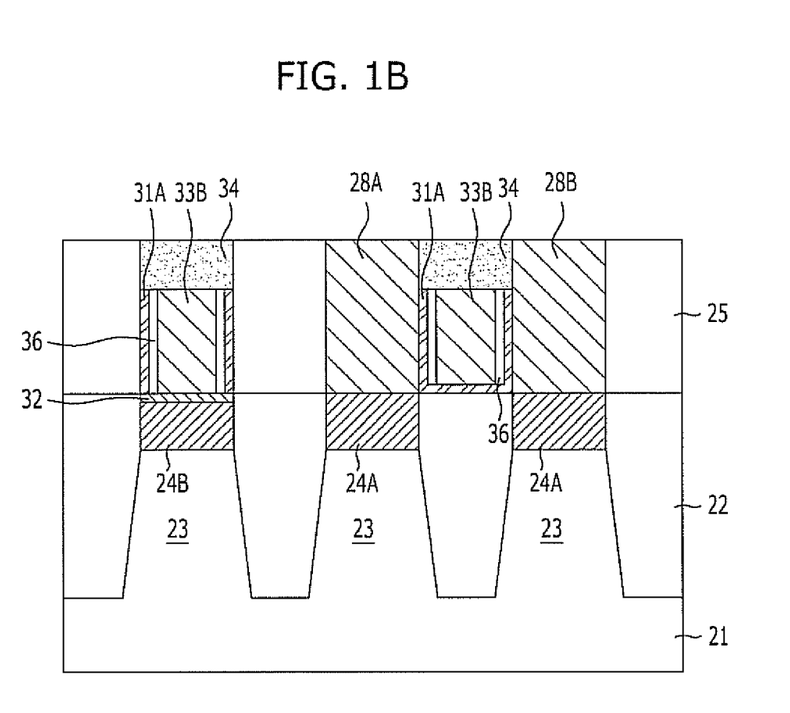
FIG. 1B is a cross-sectional view taken along a line A-A' shown in FIG. 1A.
Figure 1C:
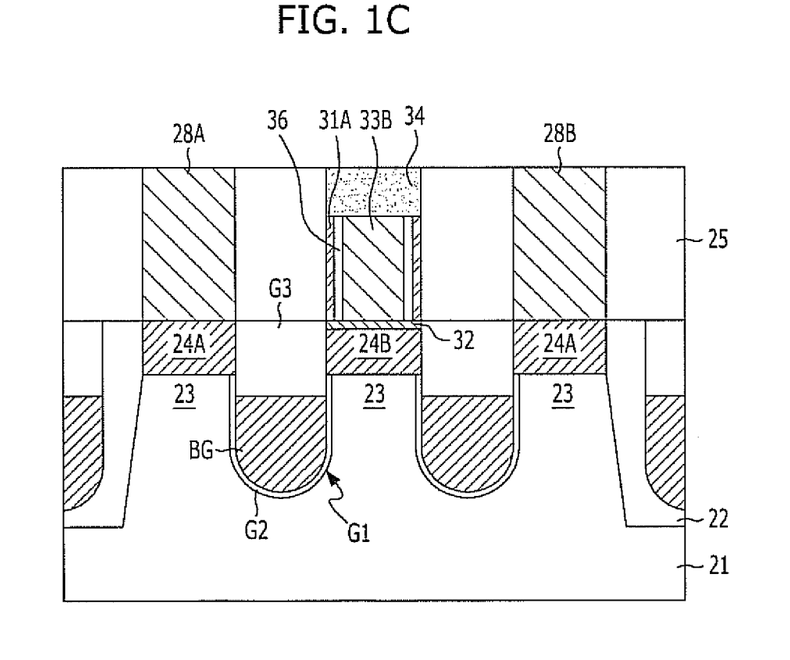
FIG. 1C is a cross-sectional view taken along a line B-B' shown in FIG. 1A.

FIG. 1A is a plan view of a semiconductor device in accordance with an exemplary embodiment of the present invention. FIG. 1B is a cross-sectional view taken along a line A-A shown in FIG. 1A. FIG. 1C is a cross-sectional view taken along a line B-B' shown in FIG. 1A.

Referring to FIGS. 1A to 1C, the semiconductor device in accordance with the exemplary embodiment of the present invention includes a buried gate structure including a buried gate BG and a damascene structure including a bit line 33B. The buried gate structure includes a gate trench G1, a gate dielectric layer G2, a buried gate BG, and a sealing layer G3. The damascene structure includes a bit line 33B, a spacer 36 formed on the sidewalls of the bit line 33B, a capping layer 34 formed over the bit line 33B and the spacer 31A, and an air gap formed between the bit line 33B and the spacer 31A.

The structure, of the semiconductor device in accordance with the exemplary embodiment of the present invention will be described in more detail hereinafter.

An isolation layer 22 is formed in a semiconductor substrate 21. An active region 23 is defined by the isolation layer 22. First and second landing plugs 24A and 24B are formed over the active region 23. Storage node contact (SNC) plugs 28A and 28B are formed over the first landing plugs 24A, respectively. A bit line 33B is formed over the second landing plug 246. The SNC plugs 28A and 28B are isolated by the bit line 33B. That is, the bit line 33B is formed between the SNC plugs 28A and 28B. The bit line 33B and the SNC plugs 28A and 28B are formed in the interlayer dielectric layer 25. The bit line 33B is referred to as a damascene bit line. The capping layer 34 is formed over the bit line 33B. Between the bit line 33B and the SNC plugs 28A and 28B, the air gap 36 and the spacer 31A are formed. The spacer 31A includes a dielectric layer such as silicon nitride or silicon oxide. The SNC plugs 28A and 28B include a polysilicon layer. A symbol BG represents a buried gate.

According to the above-described structure, the air gap 36 and the spacer 31A are arranged between the SNC plugs 28A and 288 and the bit line 33B. As the air gap 36 is formed between the SNC plugs 28A and 28B and the bit line 33B, parasitic capacitance between the storage node contact plugs 28A and 286 and the bit line 33B may be reduced in an effective manner.

The air gap 36 is formed by volume contraction of the bit line 33B. The bit line 33B includes a conductive material of which the volume is contracted by heat. The conductive material may include one or more selected from the group consisting of titanium nitride, tungsten nitride, and tungsten.

FIGS. 2A to 2I are diagrams illustrating a method for fabricating a semiconductor device in accordance with an exemplary embodiment of the present invention. FIGS. 2A to 2I are cross-sectional views taken along a line A-A' shown in FIG. 1A.

Figure 2A:
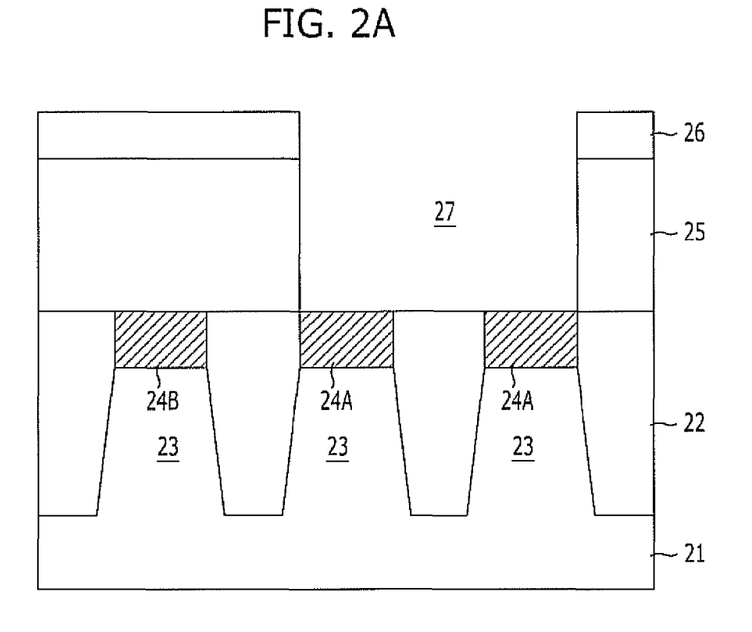
FIGS. 2A to 2I are diagrams illustrating method for fabricating a semiconductor device in accordance with an exemplary embodiment of the present invention.

Referring to FIG. 2A, an isolation layer 22 is formed in a semiconductor substrate 21. The isolation layer 22 is formed by a well-known shallow trench isolation (STI) process. The isolation layer 22 may be formed of a high density plasma (HDP) oxide layer or a spin-on dielectric (SOD) layer. The active region 23 is defined by the isolation layer 22. The active region 23 may be formed in an island type which is arranged in a diagonal direction as shown in the plan view. Although not illustrated, a buried gate process may be performed after the isolation layer 22 is formed. Since the buried gate BG is not illustrated along the line A-A', the buried gate process may be performed by referring to a well-known method. For example, referring to FIG. 1C, the buried gate BG is formed in a gate trench G1 formed in the semiconductor substrate 2L The gate dielectric layer G2 is formed on the surface of the gate trench G1. The buried gate BG partially fills the gate trench G1, and the sealing layer G3 is formed over the gate dielectric layer G2. As a result, the gate trench G1, the gate dielectric layer G2, the buried gate BG, and the sealing layer G3 form the buried gate structure. The buried gate structure is buried in the semiconductor substrate 21.

The semiconductor substrate 21 has a plurality of contact surfaces of which reference numeral is omitted. For example, the contact surfaces may include a contact surface for a bit line contact and a contact surface for an SNC. The buried gate structure is buried in the semiconductor substrate 21 between the contact surfaces. The contact surface is defined on the surface of the active region 23.

The landing plugs 24A and 24B are formed on the respective contact surfaces. For the illustrative purpose, the landing plug 24A is referred to as a first landing plug 24A which is to be coupled to an SNC plug, and the landing plug 24B is referred to as a second landing plug 24B which is to be coupled to a bit line. The first and second landing plugs 24A and 24B may be self-aligned with the isolation layer 22. The first and second landing plugs 24A and 246 include a polysilicon layer. The first and second landing plugs 24A and 246 are formed only on the surfaces of the active region 23.

In another exemplary embodiment of the present invention, the first and second landing plugs 24A and 24B may be formed before the isolation layer 22 is formed. For example, a conductive layer used as the first and second landing plugs 24A and 246 may be formed, and then etched through an STI process to form the first and second landing plugs 24A and 24B. Then using the first and second landing plugs 24A and 24B as an etch barrier, the semiconductor substrate 21 is etched to form trenches and the isolation layer 22 is then formed to fill the trenches.

In another exemplary embodiment, the first and second landing plugs 24A and 246 may not be formed. That is, the bit line contact plug and the SNC plugs may be directly contacted with the active region.

On the entire surface of he resultant structure including the first and second landing plugs 24A and 24B, an interlayer dielectric layer 25 is formed. The interlayer dielectric layer 25 includes an oxide layer such as boron phosphorus silicate glass (PSG). The interlayer dielectric layer 25 may be formed by stacking oxide and nitride or formed by sequentially stacking oxide, nitride, and oxide.

The interlayer dielectric layer 25 is etched using an SNC mask 26 as an etch barrier. Accordingly, a first open portion 27 is formed to open the adjacent two landing plugs, i.e., the first landing plugs 24A over the active region 23. For example, the first open portion 27 may be referred to as a merged SNC hole. That is, the first open portion 27 is provided by forming the respective SNC holes at the same time. The first open portion 27 may have such a shape as to simultaneously open the first landing plugs 24A adjacent in a direction parallel to the buried gate BG.

Figure 2B:
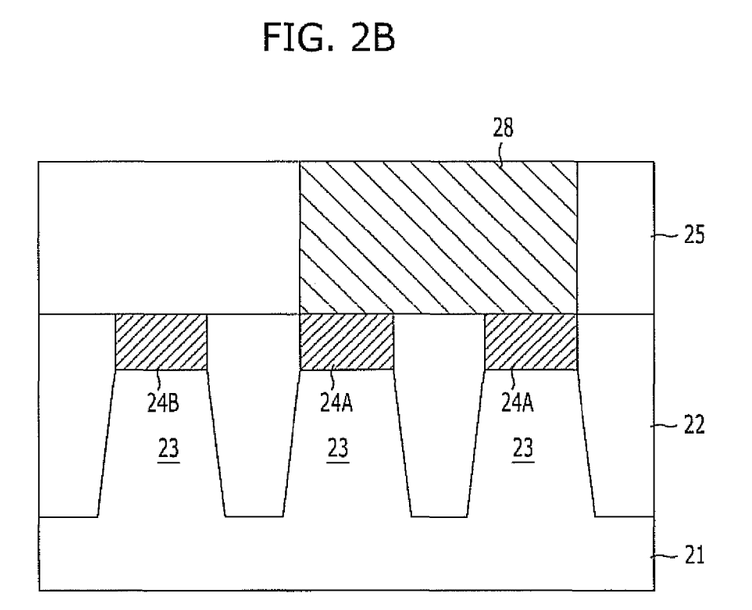

Referring to FIG. 2B, the SNC mask 26 is removed. Then, a preliminary first conductive pattern buried in the first open portion 27, for example, a preliminary SNC plug 28 is formed. In order to form the preliminary SNC plug 28 a polysilicon layer is deposited as a first conductive layer, and a chemical mechanical polishing (CMP) process or an etch-back process is performed.

Figure 2C:
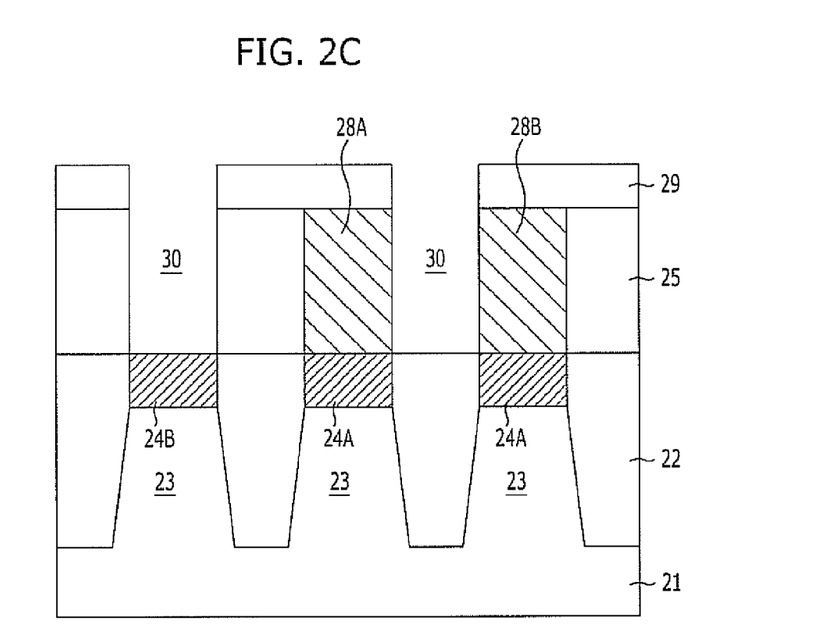

Referring to FIG. 2C, a damascene mask 29 is formed. The damascene mask 29 is a mask for separating the preliminary SNC plug 28 and forming a damascene pattern in which a bit line is to be formed. The damascene mask 29 includes a photoresist layer pattern or hard mask layer pattern, Hereafter the damascene mask 29 is referred to as a hard mask layer pattern 29. The hard mask layer pattern 29 includes nitride such as silicon nitride.

The preliminary SNC plug 28 and the interlayer dielectric layer 25 are etched using the hard mask layer pattern 29 as an etch barrier. Accordingly, a second open portion 30 referred to as a damascene pattern is formed, and two first conductive patterns, for example, SNC plugs 28A and 286, which are isolated by the second open portion 30, are formed. Furthermore, the second open portion 30 exposes the second landing plug 24B and the isolation layer 22. In order to form the second open portion 30, the preliminary SNC plug 28 is first etched, and the interlayer dielectric layer 25 is then etched. Alternatively, the interlayer dielectric layer 25 may be first etched, and the preliminary SNC plug 28 may be then etched. Alternatively, the interlayer dielectric layer 25 and the preliminary SNC plug 28 may be simultaneously etched. The second open portion 30 is formed in a line type including a portion which exposes the second landing plug 24B and a portion which is formed between the SNC plugs 28A and 28B. In other words, the second open portion 30 is a line-type trench pattern which provides a space where a bit line is to be formed.

Figure 2D:
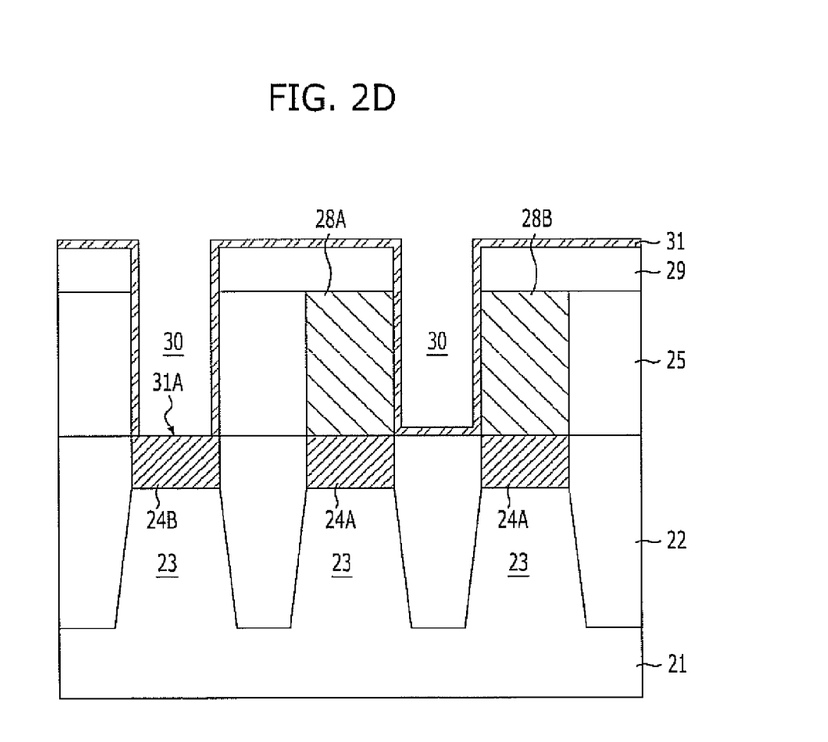

Referring to FIG. 2D, a spacer 31 is formed to expose a bit line contact surface 31A. The spacer 31 is formed by the following process: a spacer layer is formed on the entire surface of the resultant structure including the second open portion 30 and then selectively removed. The spacer layer includes a dielectric layer such as silicon nitride or silicon oxide. For example, the bit line contact surface 31A corresponds to the surface of the second landing plug 24B.

Such a spacer 31 exposes the bit line contact surface 31A and is formed on the entire surface of the other area. For example, the spacer 31 remains on the surface of the isolation layer 22 between the SNC plugs 28A and 28B. Accordingly, a bit line and the first landing plug 24A are substantially prevented from being shorted. An additional mask (not illustrated) is used to leave the spacer 31 on the bottom surface between the SNC plugs 28A and 28B. The additional mask is a bit line contact mask which is patterned in such a manner as to selectively expose only the second landing plug 248. The spacer 31 becomes a bit line spacer.

Figure 2E:
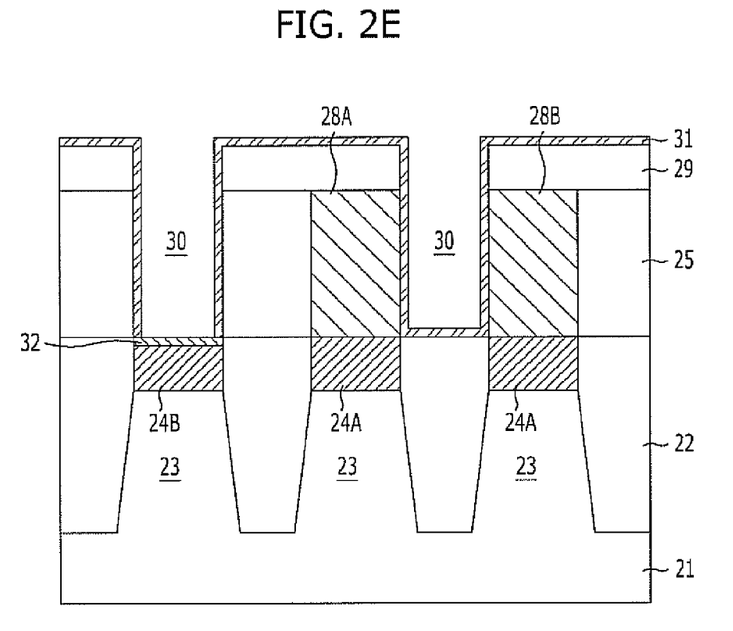

Referring to FIG. 2E, ion implantation is performed to secure bit line contact resistance. Then a metal silicide 32 for ohmic contact is formed. The metal silicide 32 is formed by depositing and annealing, a refractory metal. An unreacted refractory metal is stripped and removed. The refractory metal includes titanium, and may be formed by stacking titanium and titanium nitride. The refractory metal may be formed by chemical vapor deposition (CVD) or physical vapor deposition (PVD). When the reacted refractory metal contains titanium, an SPM cleaning process including sulfuric acid and hydrogen peroxide is used to strip the unreacted refractory metal. The metal silicide 32 may include titanium silicide.

Figure 2F:
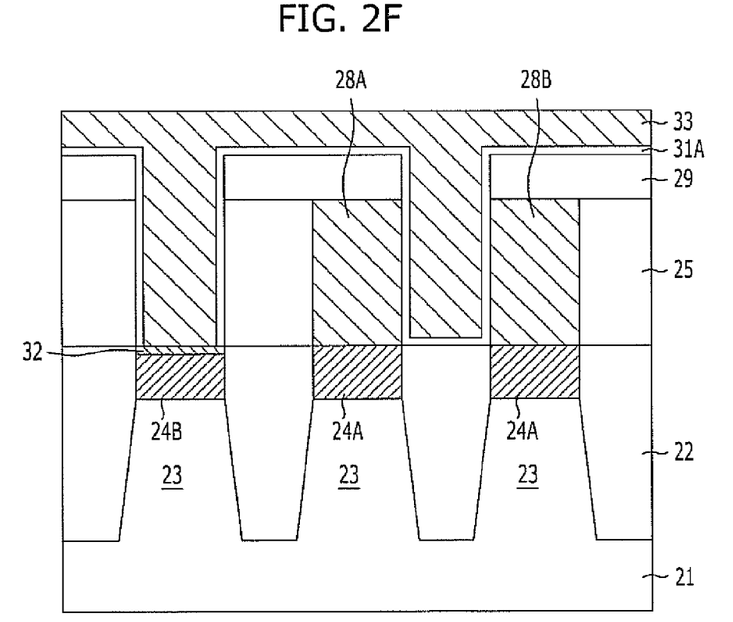

Referring to FIG. 2F a conductive layer 33 is formed on the entire surface of the resultant structure so as to fill the second open portion 30. At this time, the conductive layer 33 is a material to be used as a bit line. The conductive layer 33 is formed of a material which is contacted by a subsequent thermal process. Furthermore, the conductive layer 33 has low resistance to improve the resistance of the bit line. Desirably, the conductive layer 33 includes one or more selected from the group consisting of titanium nitride (TIN), tungsten nitride (WN), and tungsten (W). For example, the conductive layer 33 may be formed of only titanium nitride. Alternatively, the conductive layer 33 may be formed by stacking tungsten nitride and tungsten. The tungsten nitride and tungsten are formed using a metal organic source.

As, the low-resistance metal-containing material is used as the conductive layer 33, the resistance of the bit line may be reduce. As will be described below, the conductive layer 33 is formed of a material of which the volume is contacted by heat, in order to provide an air gap, Here, the volume contraction occurs due to grain growth or agglomeration.

Figure 2G:
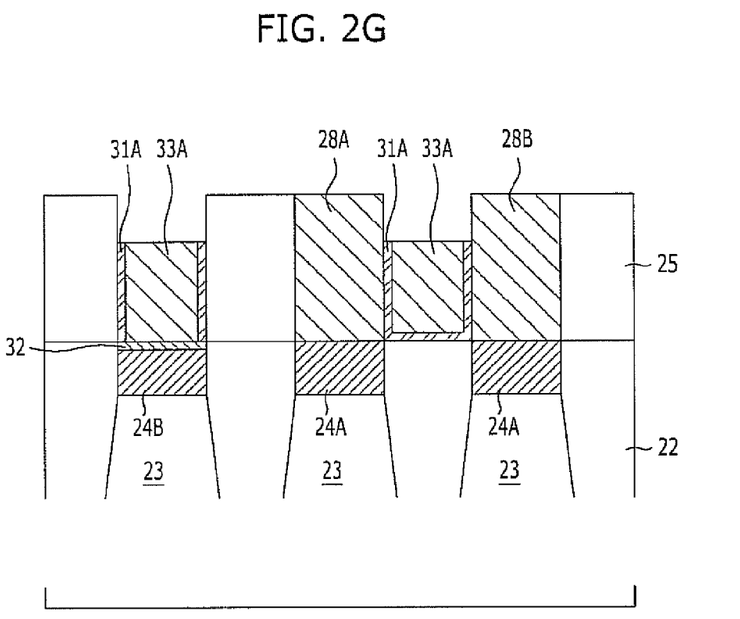

Referring to FIG. 2G, the conductive layer 33 is recessed. As the conductive layer 33 is recessed, a second conductive pattern, for example, a bit line 33A is formed. After the conductive layer 33 is recessed, the spacer 31 is recessed. Therefore, the bit line 33A and the spacer 31A are formed inside the second open portion 30 shown in FIG. 2E.

When the bit line 33A is formed in such a manner, the spacer 31A is deposited between the bit line 33A and the SNC plugs 28A and 29A.

Meanwhile, the process for recessing the conductive layer 33 may be performed by sequentially applying a CMP process and an etch-back process. Furthermore, after the conductive layer 33 and the spacer 31 are recessed, the hard mask layer pattern 29 is removed.

Figure 2H:
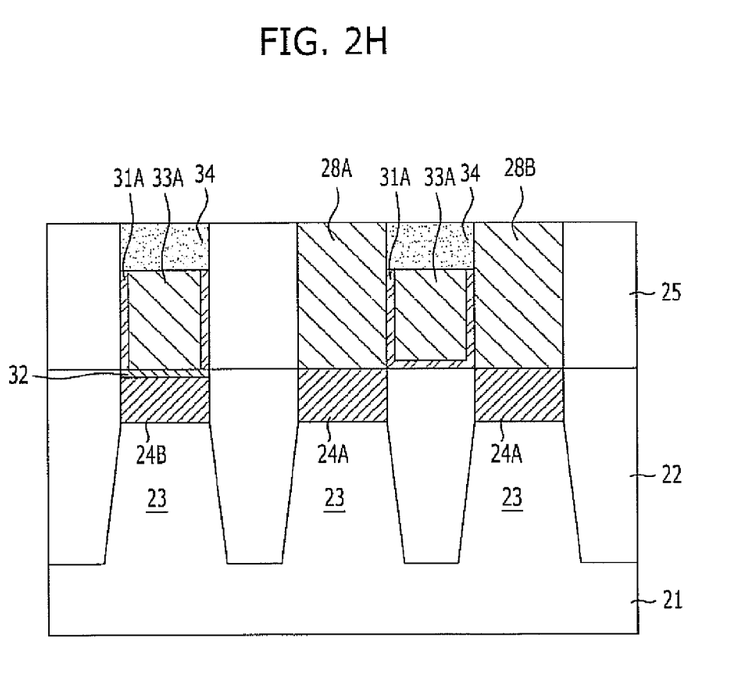

Referring to FIG. 2H, a capping layer 34 is formed to gap-fill a space over the bit line 33A. Then, an isolation process such as CMP is used to form the capping layer 34 within the second open portion, The capping layer 34 includes silicon nitride formed by a plasma-enhanced CVD (PECVD) method. Furthermore, the capping layer 34 may include an oxide layer such as silicon oxide.

Figure 2I:
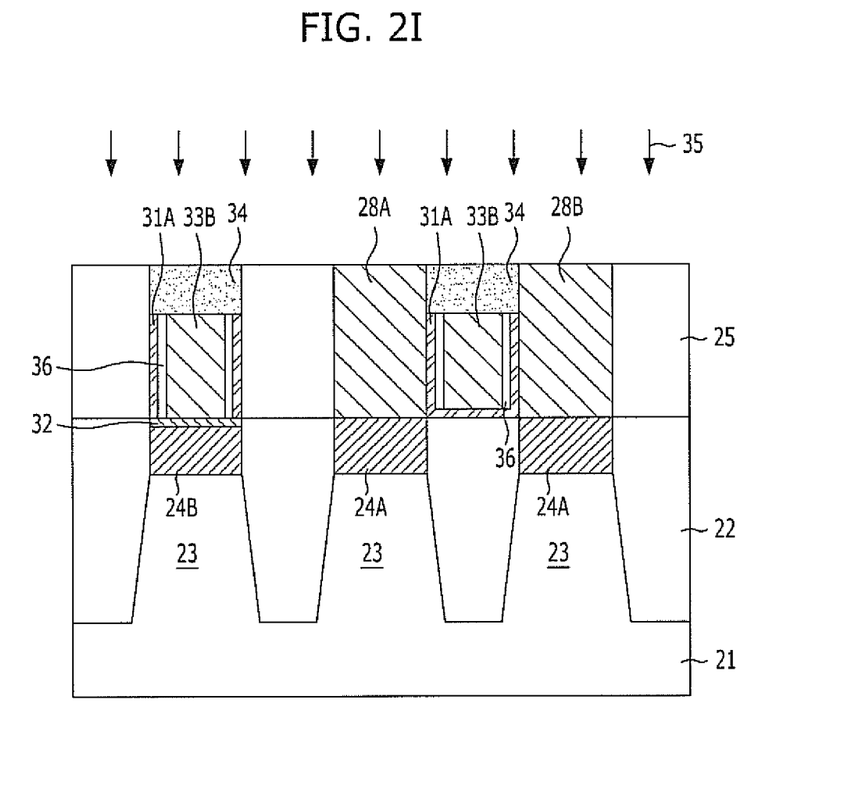

Referring to FIG. 21, a thermal process 35 is performed. At this time, the thermal process 35 is performed by rapid thermal processing (RTP) or a furnace heat treatment. The RTP is performed at a temperature of 500~1100° C. for 1~200 seconds, and the heat treatment atmosphere includes one or more gases selected from $N_2$, $O_2$, $NH_3$, and Ar. The furnace heat treatment is performed at a temperature of 500~1000° C. for 3~180 minutes, and the heat treatment atmosphere includes one or more gases selected from. $N_2$, $O_2$ $NH_3$, and Ar.

The volume of the bit tine 33A is contracted by the above-described thermal process 35. That is, grain growth and agglomeration occur in the material used as the bit line 33A. Therefore, an air gap 36 is formed between the contracted bit line 33B and the spacer 31A.

Figure 3:
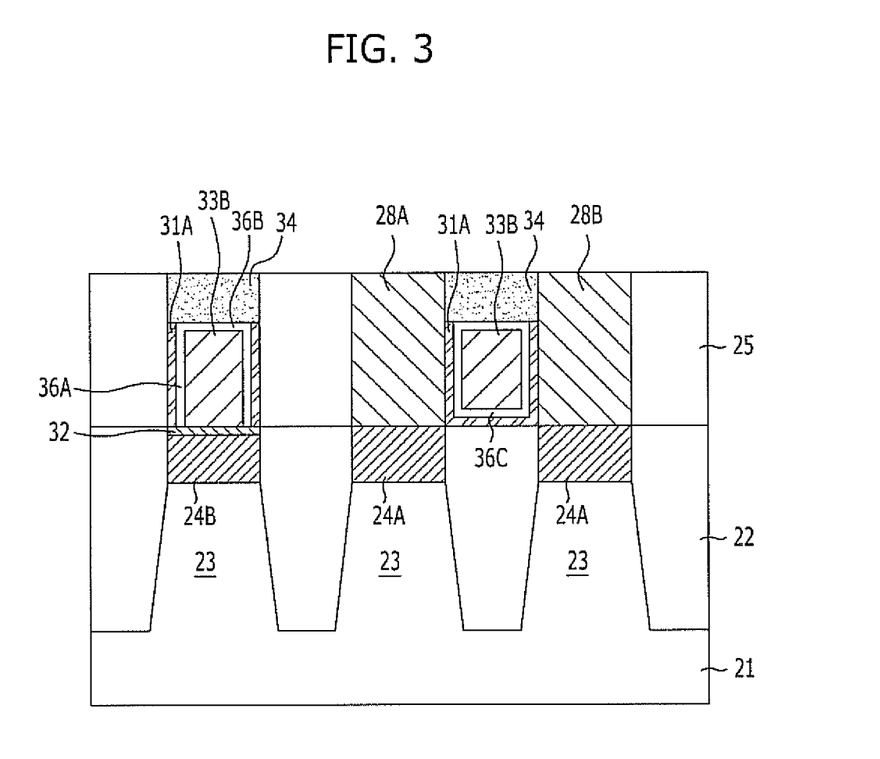
FIG. 3 is a diagram illustrating a semiconductor device in accordance with a modified exemplary embodiment of the present invention.

FIG. 3 is a diagram illustrating a semiconductor device in accordance with a modified exemplary embodiment of the present invention.

In the semiconductor device in accordance with the modified exemplary embodiment of the present invention, an air gap 36A may be formed between the bit line 33B and the spacer 31A, and simultaneously, an air gap 36B may be formed at the interface between the capping layer 34 and the bit line 33B. Furthermore, an air gap 36C may be formed between the spacer 31A and the bit line 33 on the bottom between the SNC plugs 28A and 28B. As such, the air gaps 36A, 36B, and 36C may be formed at the sidewalls and the upper and lower portions of the bit line 33B. Since the lower portion of the bit line 33B is contacted with the metal silicide 32, lifting does not occur.

The air gaps 36B and 36C formed at the upper and lower portions of the bit line 33B do not have an effect upon the bit line resistance characteristic. Furthermore, since a critical dimension (CD) between the upper portion of the bit line 33A and the capping layer 34 is small the air gap 368 may be formed.

In accordance with the above-described embodiments, the damascene structure is formed in the second open portion. The damascene structure includes the bit line 33B, the spacer 31A formed on both sidewalls of the bit line 33B, the capping layer 34 formed over the bit line 33B and the spacer 31A, and the air gap 36 formed between the bit line 33B and the spacer 31A. Furthermore, the damascene structure is formed within the dielectric layers filling the second open portion, and includes the bit line 33B which is isolated from the dielectric layers by the air gap 36. Here, the dielectric layers include the capping layer 34 and the spacer 31A.

In the above-described embodiments of the present invention, the method for forming an air gap to reduce parasitic capacitance between the bit line and the SNC plugs has been described. However, the present invention may be applied to a method for reducing parasitic capacitance between neighboring conductive patterns during a process for fabricating a memory such as DRAM or Flash. Here, the conductive pattern may include a gate, a contact plug, metal interconnections and so on. Furthermore, the conductive pattern may include a material of which the volume is contracted by heat.

In accordance with the exemplary embodiments of the present invention, the volume contraction of the bit line is used to form an air gap between the bit line and the SNC plugs. Therefore, parasitic capacitance may decrease due to a low dielectric constant of the air gap.

Furthermore, a low-resistance metal-containing material may be used to form the bit line, and simultaneously, the air gap may be formed between the bit line and the spacer. Therefore, parasitic capacitance may be reduced, and bit line resistance may be improved. Accordingly, an operation margin of cells may be secured and the device characteristic may be improved in an effective manner.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a substrate having a plurality of contact surfaces;
   an interlayer dielectric layer formed over the substrate and having a first open portion which exposes a part of the contact surfaces and a second open portion which exposes the other contact surfaces;
   a storage node contact (SNC) plug filling the first open portion; and
   a damascene structure filing the second open portion and comprising a bit line, a spacer formed on both sidewalls of the bit line, a capping layer formed over the bit line and the spacer, and an air gap that is formed between the bit line and the spacer,
   wherein the bit line comprises a conductive material which has a volume contraction property at a certain temperature.

2. The semiconductor device of claim 1, wherein the storage node contact (SNC) plug comprises a conductive material which has not volume contraction property at the certain temperature.

3. A semiconductor device comprising:
   a substrate having a plurality of contact surfaces;
   an interlayer dielectric layer formed over the substrate and having a first open portion which exposes a part of the contact surfaces and a second open portion which has a line shape to expose the other contact surfaces and a first portion between two adjacent contact surfaces among the other contact surfaces;
   a storage node contact (SNC) plug filling the first open portion; and
   a damascene structure filing the second open portion and comprising a bit line, a spacer formed on at least both sidewalls of the bit line, and an air gap that is formed between the bit line and the spacer,
   wherein uppermost portions of the other contact surfaces include a metal silicide,
   the spacer is further formed under the bit line and the air gap in a region overlapping with the first portion, and a bottom surface of the bit line directly contacts the metal silicide while directly contacting the spacer in the region overlapping with the first portion,
   wherein the air gap surrounds the bit line in the region overlapping with the first portion.

4. The semiconductor device of claim 3 wherein the damascene structure further comprises a capping layer formed over the bit line, the spacer, and the air gap.

5. The semiconductor device of claim 3, wherein the air gap is further formed at the entire interface between the capping layer and the bit line.

* * * * *